United States Patent
Chen et al.

(10) Patent No.: US 7,179,678 B1
(45) Date of Patent: Feb. 20, 2007

(54) EBIC RESPONSE ENHANCEMENT IN TYPE III-VI SEMICONDUCTOR MATERIAL ON SILICON

(75) Inventors: Zhizhang Chen, Corvallis, OR (US); Hang Liao, Corvallis, OR (US); David M. Schut, Philomath, OR (US); Michael Setera, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 200 days.

(21) Appl. No.: 10/927,276

(22) Filed: Aug. 26, 2004

(51) Int. Cl.
*H01L 21/00* (2006.01)

(52) U.S. Cl. .................. 438/95; 438/509; 438/796; 257/E21.497

(58) Field of Classification Search .......... 438/796; 257/E21.077, E21.471, E21.497
See application file for complete search history.

(56) References Cited

U.S. PATENT DOCUMENTS

| | | | | |
|---|---|---|---|---|
| 5,436,204 A | * | 7/1995 | Albin et al. ................ 438/488 |
| 5,441,897 A | * | 8/1995 | Noufi et al. ................ 438/95 |
| 5,578,503 A | * | 11/1996 | Karg et al. .................. 438/95 |
| 5,674,555 A | * | 10/1997 | Birkmire et al. ............. 427/76 |
| 2002/0113250 A1 | * | 8/2002 | Chaiken et al. ............. 257/200 |

FOREIGN PATENT DOCUMENTS

| | | | |
|---|---|---|---|
| EP | 318315 A2 | * | 5/1989 |
| WO | WO 99/39385 | | 8/1999 |

* cited by examiner

*Primary Examiner*—Stephen W. Smoot

(57) ABSTRACT

A method of processing a type III–VI semiconductor material on a silicon substrate to improve minority carrier diffusion length and EBIC response is provided. The semiconductor material is heated to a temperature in the range of 300° C.–600° C. for a period in the range of 20 seconds to 60 minutes in an atmosphere having a composition of 0–10% of hydrogen in nitrogen.

20 Claims, 4 Drawing Sheets

EBIC RESPONSE ENHANCEMENT IN TYPE III–VI SEMICONDUCTOR MATERIAL ON SILICON

TECHNICAL FIELD

This invention relates to the processing of semiconductors to improve material performance. In particular the invention relates to passivation of Type III–VI semiconductor material formed on a silicon substrate to improve its EBIC Signal Response.

BACKGROUND OF THE INVENTION

One of the major challenges when working with type III–VI Semiconductor materials such as InSe or GaSe is the low minority carrier diffusion length, which is indicated by low EBIC (electron beam induced current) signal response. This is because of a high surface recombination velocity at the surface and at material interfaces, and the existence of bulk defects or recombination centers. EBIC response of semiconductor materials is an important parameter for assessing material performance and good EBIC response is required to achieve acceptable device performance in most applications.

SUMMARY OF THE INVENTION

Accordingly a method is provided for the processing a type III–VI semiconductor on a silicon substrate. In this process the semiconductor is heated to a temperature in the range of 300° C.–600° C. for a period of 20 seconds to 60 minutes in an atmosphere composed of in the range of 0–10% of hydrogen in nitrogen.

BRIEF DESCRIPTION OF THE DRAWINGS

FIG. 3 is a set of plots produced during EBIC analysis of two type III–VI semiconductor samples formed on silicon substrates, the first of which is a reference sample and the second of which was annealed according to the present process, in which FIG. 4 is a set of plots of XRD analysis of a plurality of a type III–VI semiconductor samples on silicon substrates annealed according to the present process and one reference sample wherein

DESCRIPTION OF AN EXEMPLARY EMBODIMENT

A process of annealing type III–VI semiconductor material on a silicon substrate will now be described by way of example with particular reference to InSe/GaSe materials.

Experiments

Figure 1:
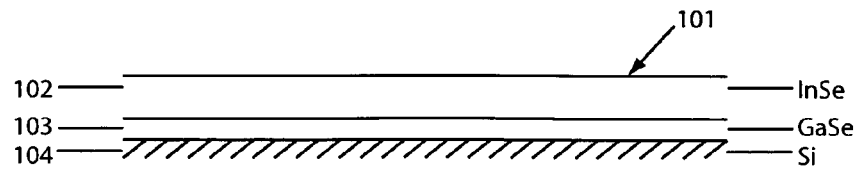
FIG. 1 is a diagrammatic illustration of a type III–VI semiconductor sample formed on a silicon substrate.

Referring to FIG. 1, one experiment was performed on samples 101 coming from a wafer targeted to have a 100 nm layer of InSe 102 over a 10 nm layer of GaSe 103 on a p-type Silicon <111> substrate 104. The samples 101 were grown on the substrate 104 by Molecular Beam Epitaxy (MBE), and one sample was designated as a reference sample which underwent no further processing. The reference sample was used for base line measurement, while the remaining samples were processed in a Rapid Thermal Process (RTP) system.

Figure 2:
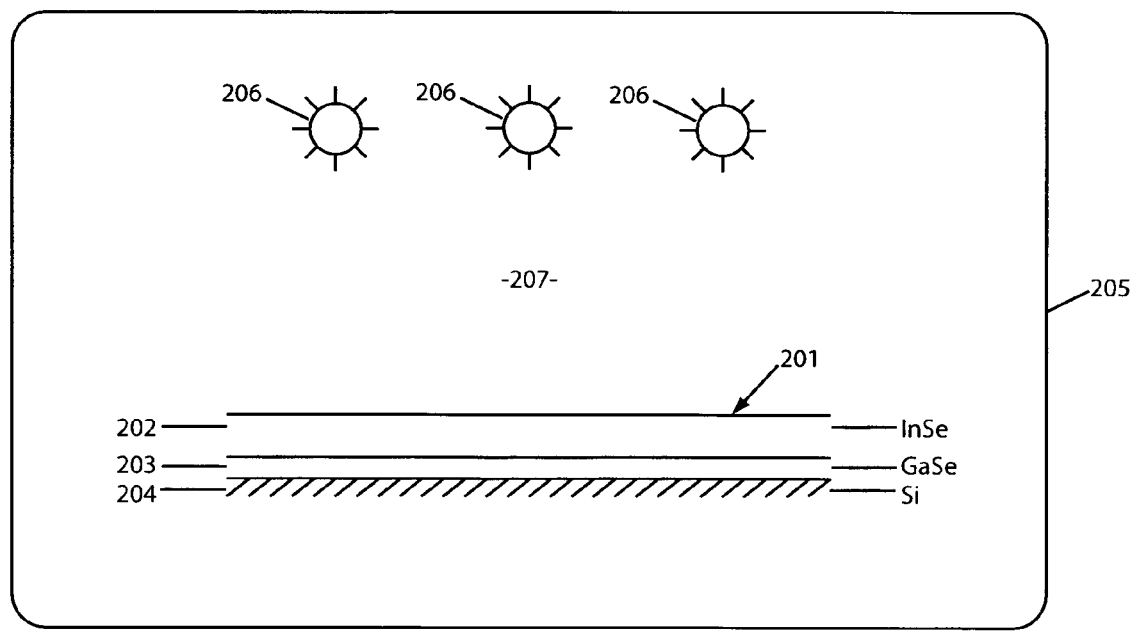
FIG. 2 is a diagrammatic illustration of a RTP chamber shown processing a type III–VI semiconductor sample of the type illustrated in FIG. 1.
Figure 3A:
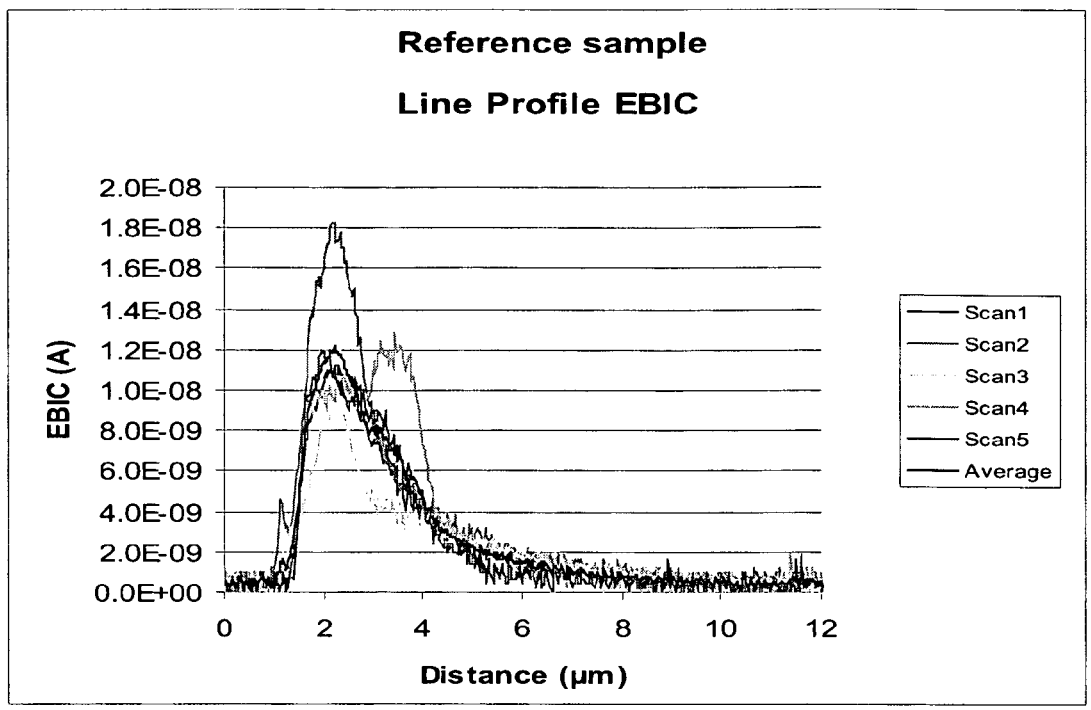
FIG. 3(a) shows the EBIC amplitude plots for 5 line scans over the reference sample as well as a plot of the average; 3(b) shows the EBIC gain plots for 5 line scans over the reference sample as well as a plot of the average.
Figure 3B:
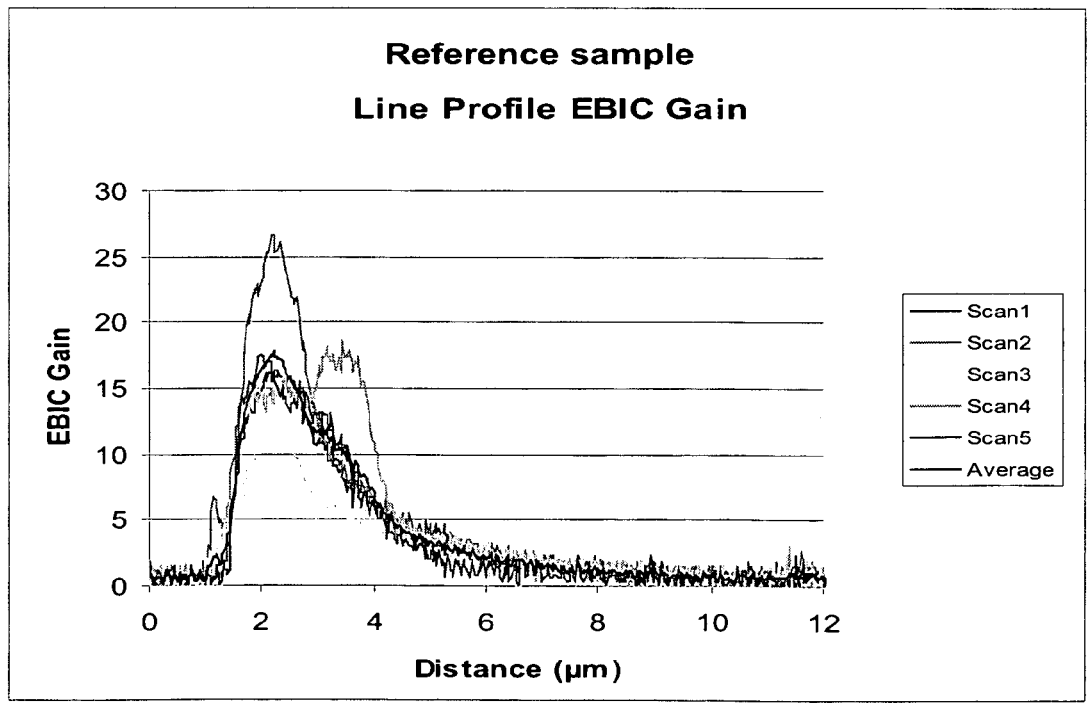
Figure 3C:
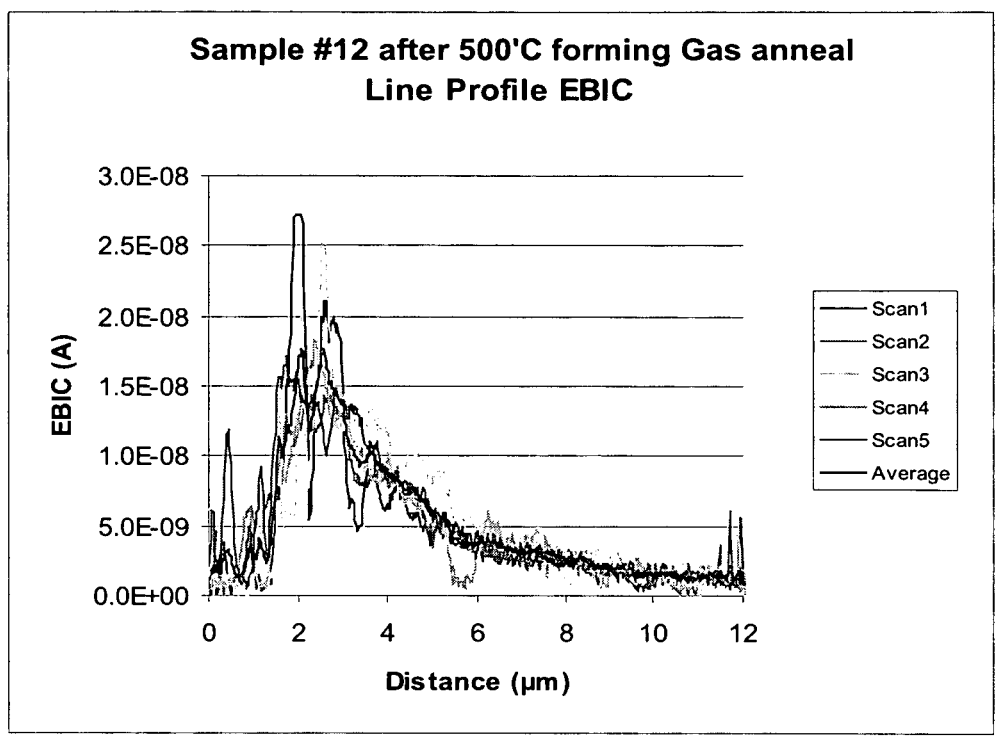
FIG. 3(c) shows the EBIC amplitude plots for 5 line scans over sample #12 (Processed at 500° C. in Forming Gas) as well as a plot of the average; and 3(d) shows the EBIC gain plots for 5 line scans over sample #12 as well as a plot of the average.
Figure 3D:
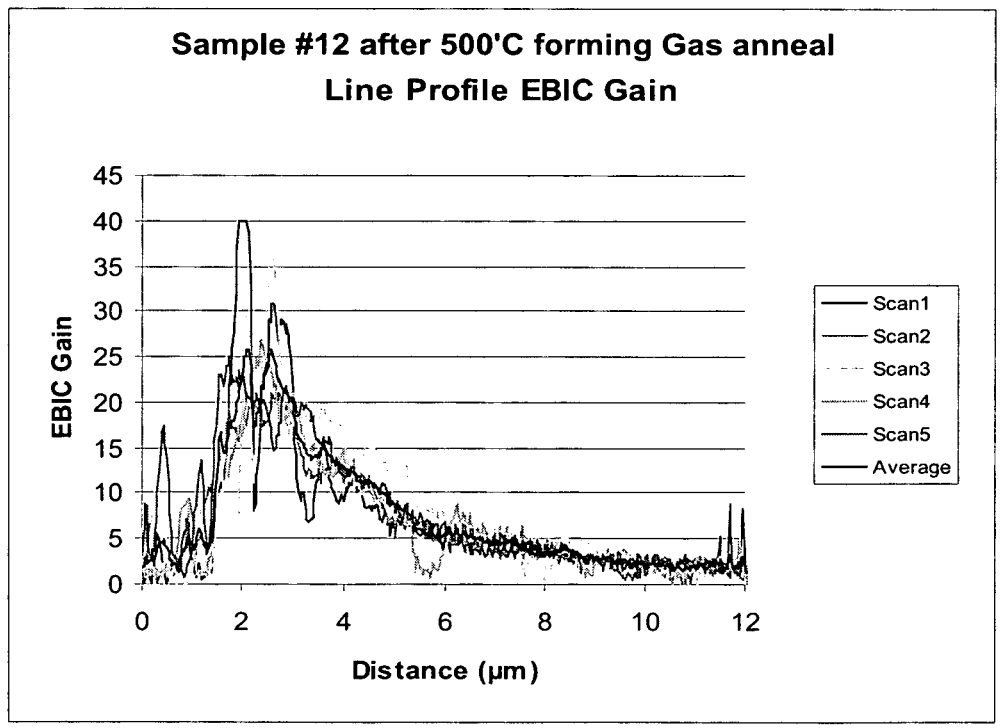

Referring to FIG. 2, the further processing of all but the baseline sample involved placing the respective sample 201, comprising a 100 nm layer of InSe 202 over a 1 nm layer of GaSe 203 on a p-type Silicon <111> substrate 204 as before, in an RTP chamber 205 and processing the material at a process temperature controlled to be in the range of 450° C.–600° C. The RTP chamber uses high power lamps 206 as heating elements.

The process was run for a period of 20 minutes with an atmosphere 207 in the RTP chamber of either;
  i) Nitrogen ($N_2$), or
  ii) a forming gas composition of 4% of Hydrogen ($H_2$) in Nitrogen ($N_2$)

EBIC analysis of each sample was then performed and the EBIC and XRD analysis of each of the samples processed in Nitrogen or forming gas (4% $H_2$ and 96% $N_2$) was compared with the reference sample to observe variations in the experimental outcomes due to the thermal effect and the passivation effect, respectively.

By using an RTP system to effect the thermal process, heating is performed by a light source which in this case uses a Tungsten-Halogen source. Accordingly a photonic or photo-electronic effect is introduced, which is fundamentally different from a thermal anneal and is seen to generally improve the results obtained as compared with a thermal processes in a dark environment.

The processes can be performed at temperatures in a range of 300° C.–600° C. while still providing a beneficial effect, depending on the film being processed and other process parameters selected. However processes running at 450° C.–525° C. appear to provide the best results. The annealing time can be in a range of 20 seconds to 60 minutes, and will preferably be in the range of 10–60 minutes. A process time in the range of 15–25 minutes is considered useful for the described experiments. The process can be performed in nitrogen atmosphere (i.e 0% hydrogen ($H_2$)) but is preferably performed in a forming gas atmosphere containing 4–10% hydrogen ($H_2$) in Nitrogen ($N_2$). A Hydrogen concentration in the range of 4 –5% is considered useful in the described experiments. In an embodiment the process is performed at a temperature of 500° C.–525° C. for 19–21 minutes in an atmosphere of in the range of 3.9–4.1% Hydrogen ($H_2$) in Nitrogen ($N_2$).

By using the process described, in which InSe/GaSe is processed by an RTP system, preferably employing a forming gas atmosphere, significant improvement in both EBIC current gain, and EBIC span can be demonstrated.

EBIC Measurement

Five EBIC current line scans and associated current gain were run across each sample, with the averages determined to produce the measurements summarized in Table 1 below. The data was generated with an Incident beam current of 0.674 nA, and no bias was applied to the device. FIG. 3 shows exemplary plots of (a) the EBIC amplitude and (b) the EBIC gain of the reference sample and (c) the EBIC amplitude and (d) the EBIC gain of sample number 12 after processing in Forming Gas at 500° C. Note that the left (rising) edge prior to the peak of the EBIC plots corresponds to the approximate pad edge location.

TABLE 1

| Sample ID | Process Environment | Maximum Temperature value | EBIC Gain | EBIC span at gain of 5 |
|---|---|---|---|---|
| #5 | N/A | reference | ~25 | ~2.2 µm |
| #11 | Forming Gas | 450° C. | ~14 | ~2 µm |
| #12 | Forming Gas | 500° C. | ~40 | ~5 µm |
| #13 | Forming Gas | 525° C. | ~40 | ~6 µm |
| #10 | Forming Gas | 550° C. | ~2 | 0 µm |
| #1 | $N_2$ | 450° C. | ~25 | ~5 µm |
| #2 | $N_2$ | 500° C. | ~20 | ~5 µm |
| #3 | $N_2$ | 550° C. | ~12 | ~2 µm |

Results

Table 1 shows that forming gas passivation at 500° C.–525° C. significantly improves EBIC response in both maximum gain and EBIC spatial span. Compared with reference sample, the maximum gain increased by more than 60%, from 25 to 40, and EBIC span, at a gain of 5, improved from 2 to 5 microns. On the other hand, less substantial improvements were observed for the sample annealed in nitrogen, which suggests that, in the case of the samples processed in forming gas, while there is contribution to the outcome due to a thermal effect alone there is also a significant contribution to the improvement due to forming gas passivation.

X-Ray Diffraction Measurement

Figure 4A:
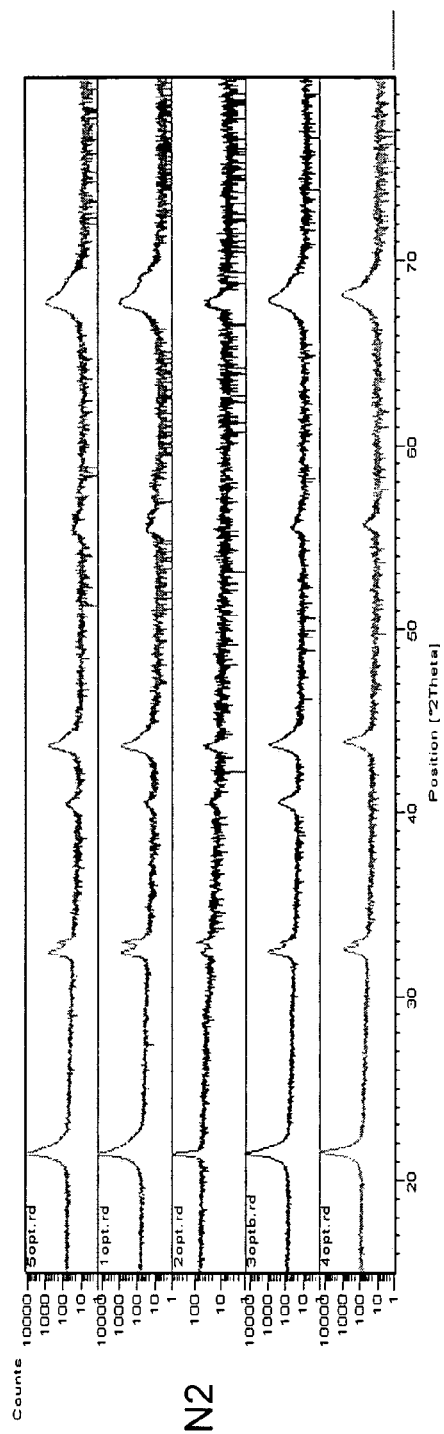
FIG. 4(a) shows the plots for the reference sample and the samples annealed in Nitrogen and FIG. 4(b) shows the plots for the samples annealed in Forming Gas.
Figure 4B:
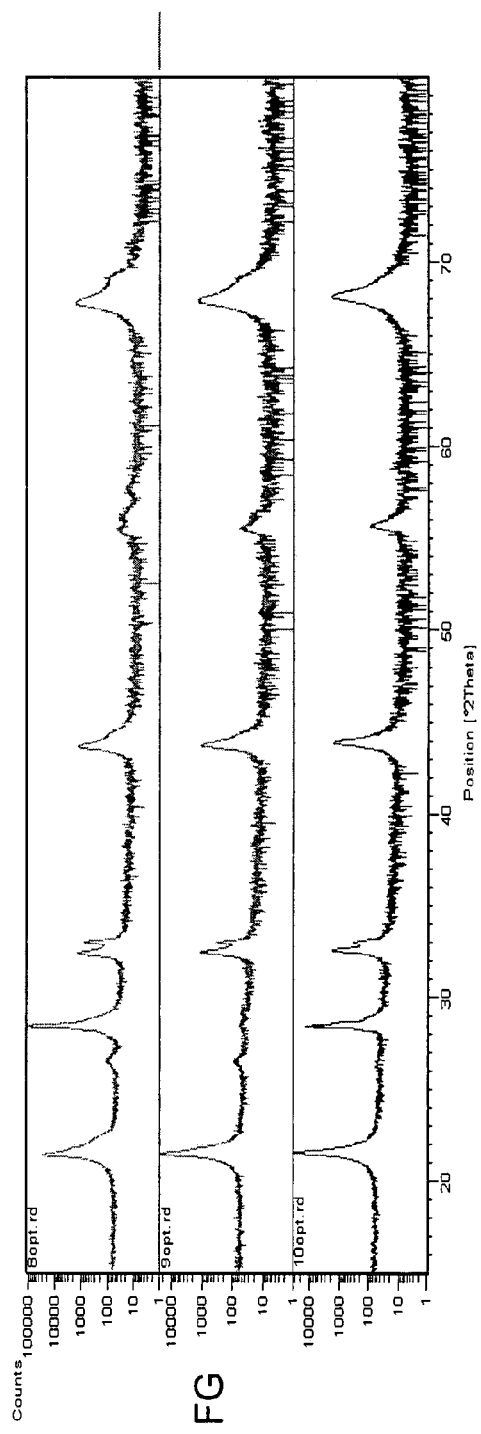

Differences in film structure between the reference sample and samples that have undergone $N_2$ and Forming Gas treatments were also observed by X-Ray Diffraction (XRD) measurement which is shown in FIG. 4 in which FIG. 4(*a*) shows the XRD results for the reference sample and the samples after processing in Nitrogen at 450° C., 500° C., 550° C. and 600° C. and FIG. 4(*b*) shows the XRD results for the samples after processing in Forming Gas at 450° C., 500° C. and 550° C.

Thus various embodiments and components have been shown for processing a type III–VI semiconductor on a silicon substrate, and these may be used singly or in combination, or with other elements known in the arts of semiconductor manufacture. It is understood that these and other such combinations, substitutions, and alternative embodiments may be undertaken according to the requirements and materials at hand without deviating from the spirit of the invention, the scope of which is to be limited only by the claims appended hereto.

The invention claimed is:

1. A method of processing a type III–VI semiconductor material on a silicon substrate wherein the method comprises:
heating the semiconductor material to a temperature in the range of 300° C.–600° C. for a period in the range of 20 seconds to 60 minutes in an atmosphere composed of in the range of 0–10% of hydrogen in nitrogen.

2. The method of claim 1 wherein the process uses a light source as a heater.

3. The method of claim 1 wherein the process is performed in a Rapid Thermal Process (RTP) chamber.

4. The method of claim 1 wherein the process is performed at a temperature in the range of 450° C.–550° C.

5. The method of claim 1 wherein the process is performed at a temperature in the range of 500° C.–525° C.

6. The method of claim 1 wherein the process is performed for a period of in the range of 1 minute to 40 minutes.

7. The method of claim 1 wherein the process is performed for a period of in the range of 15 minutes to 25 minutes.

8. The method of claim 1 wherein the process is performed for a period of in the range of 19–21 minutes.

9. The method of claim 1 wherein the process is performed in an atmosphere of forming gas having a composition of in the range of 4–10% of hydrogen in nitrogen.

10. The method of claim 1 wherein the process is performed in an atmosphere of forming gas composed of in the range of 4–5% of hydrogen in nitrogen.

11. The method of claim 1 wherein the process is performed on a semiconductor structure including a layer of InSe.

12. The method of claim 1 wherein the process is performed on a semiconductor structure including a layer of GaSe.

13. The method of claim 1 wherein the process is performed on a semiconductor structure including a layer of InSe formed over a layer of GaSe in turn formed over silicon material.

14. A method of processing InSe semiconductor material on a silicon substrate the method comprising:
heating the semiconductor material to a temperature in the range of 450° C.–525° C. for a period in the range of 10 minutes to 60 minutes in an atmosphere composed of in the range of 0–10% of hydrogen in nitrogen.

15. The method of claim 14 wherein the process uses a light source as a heater.

16. The method of claim 14 wherein the process is performed at a temperature in the range of 500° C.–525° C.

17. The method of claim 14 wherein the process is performed for a period of in the range of 19 minutes to 21 minutes.

18. The method of claim 14 wherein the process is performed in an atmosphere of forming gas composed of in the range of 3.9–4.1% of hydrogen in nitrogen.

19. A method of processing a type III–VI semiconductor material on a silicon substrate the method comprising:
heating the semiconductor material to a temperature in the range of 300° C.–600° C. for a period in the range of 20 seconds to 60 minutes in an atmosphere composed of in the range of 0–10% of hydrogen in nitrogen, the method being performed in a Rapid Thermal Process (RTP) chamber.

20. A method of processing InSe semiconductor material on a silicon substrate the method comprising:
heating the semiconductor material to a temperature in the range of 500° C.–525° C. for a period in the range of 15 minutes to 25 minutes in an atmosphere composed of in the range of 3.9–4.1% of hydrogen in nitrogen.

* * * * *

UNITED STATES PATENT AND TRADEMARK OFFICE
CERTIFICATE OF CORRECTION

PATENT NO.         : 7,179,678 B1
APPLICATION NO.    : 10/927276
DATED              : February 20, 2007
INVENTOR(S)        : Zhizhang Chen et al.

It is certified that error appears in the above-identified patent and that said Letters Patent is hereby corrected as shown below:

In column 2, line 14, delete "1 nm" and insert -- 10nm --, therefor.

Signed and Sealed this

Tenth Day of March, 2009

JOHN DOLL
*Acting Director of the United States Patent and Trademark Office*